(12) United States Patent
Matsui et al.

(10) Patent No.: US 10,446,492 B2
(45) Date of Patent: *Oct. 15, 2019

(54) SEMICONDUCTOR INTEGRATED CIRCUIT DEVICE

(71) Applicant: SOCIONEXT INC., Kanagawa (JP)

(72) Inventors: Tooru Matsui, Takatsuki (JP); Masahiro Yoshimura, Ibaraki (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/982,766

(22) Filed: May 17, 2018

(65) Prior Publication Data

US 2018/0269153 A1 Sep. 20, 2018

Related U.S. Application Data

(63) Continuation of application No. 15/493,338, filed on Apr. 21, 2017, now Pat. No. 10,002,832, which is a (Continued)

(30) Foreign Application Priority Data

Oct. 24, 2014 (JP) .................. 2014-217334

(51) Int. Cl.
*H01L 23/52* (2006.01)
*H01L 23/528* (2006.01)
(Continued)

(52) U.S. Cl.
CPC .......... *H01L 23/5286* (2013.01); *H01L 23/60* (2013.01); *H01L 27/0207* (2013.01); *H02H 9/046* (2013.01)

(58) Field of Classification Search
None
See application file for complete search history.

(56) References Cited

U.S. PATENT DOCUMENTS 6,222,213 B1 4/2001 Fujiwara
10,002,832 B2 * 6/2018 Matsui .................... H01L 21/82
(Continued)

FOREIGN PATENT DOCUMENTS

JP H03-195045 A 8/1991
JP 2000-021987 A 1/2000
(Continued)

OTHER PUBLICATIONS

International Search Report issued in Application No. PCT/JP2015/004938 dated Dec. 15, 2015, with English translation.
(Continued)

*Primary Examiner* — Michael Lebentritt
(74) *Attorney, Agent, or Firm* — McDermott Will & Emery LLP

(57) ABSTRACT

Disclosed herein is a configuration for ensuring sufficient power supply ability and ESD protection capability for I/O cells in a semiconductor integrated circuit device, without increasing its circuit area. In two I/O cell rows, a pair of I/O cells for supplying a power supply potential or ground potential are connected together via a common power supply interconnect. The I/O cells are arranged so as to overlap with each other in a first direction in which the I/O cells are arranged. The common power supply interconnect extends in a second direction perpendicular to the first direction, and is connected to first pads that are located closest in the first direction to the common power supply interconnect.

11 Claims, 3 Drawing Sheets

Related U.S. Application Data continuation of application No. PCT/JP2015/004938, filed on Sep. 29, 2015.

(51) Int. Cl.
*H01L 23/60* (2006.01)
*H02H 9/04* (2006.01)
*H01L 27/02* (2006.01)

(56) References Cited

U.S. PATENT DOCUMENTS

| 2003/0006856 A1 | 1/2003 | Miller |
| 2003/0057549 A1 | 3/2003 | Sei |
| 2005/0127405 A1 | 6/2005 | Chen et al. |
| 2012/0273973 A1 | 11/2012 | Tomoda et al. |

FOREIGN PATENT DOCUMENTS

| JP | 2003-100891 A | 4/2003 |
| JP | 2003-526901 A | 9/2003 |
| JP | 2012-234931 A | 11/2012 |

OTHER PUBLICATIONS

Written Opinion issued in application No. PCT/JP2015/004938 dated Dec. 22, 2015, with English translation.

* cited by examiner

SEMICONDUCTOR INTEGRATED CIRCUIT DEVICE

CROSS-REFERENCE TO RELATED APPLICATION

This is a continuation of U.S. patent application Ser. No. 15/493,338 filed on Apr. 21, 2017, which is a continuation of International Application No. PCT/JP2015/004938 filed on Sep. 29, 2015, which claims priority to Japanese Patent Application No. 2014-217334 filed on Oct. 24, 2014. The entire disclosures of these applications are incorporated by reference herein.

BACKGROUND

The present disclosure relates to a semiconductor integrated circuit device including a core region and an I/O region.

In recent years, semiconductor integrated circuits have further increased their scale to have an increasing number of input and output signals. Therefore, arranging input/output cells (I/O cells) in a single row to surround a core region may define the area of the semiconductor integrated circuit, thus increasing the area of a device including the semiconductor integrated circuit, i.e., a semiconductor integrated circuit device, which is not beneficial.

Japanese Unexamined Patent Publication No. 2000-21987 discloses a configuration for a semiconductor integrated circuit in which I/O cells are arranged in multiple rows in a peripheral portion of the circuit, thereby preventing the I/O cells from defining the area of the semiconductor integrated circuit.

SUMMARY

In the configuration disclosed in Japanese Unexamined Patent Publication No. 2000-21987, in which the I/O cells are arranged in multiple concentric rows, each I/O cell row is provided with a ring-shaped power supply interconnect, to which power is supplied through an external connection pad. This configuration requires each I/O cell row to have sufficient power supply ability and electrostatic discharge (ESD) protection capability. This requirement may be met by increasing the number of the I/O cells for power supply in each I/O cell row. Unfortunately, this solution further increases the area of the semiconductor integrated circuit.

It is therefore an object of the present disclosure to provide a configuration for a semiconductor integrated circuit device which is capable of ensuring sufficient power supply ability and ESD protection capability for an I/O cell, without causing an increase in the area of the semiconductor integrated circuit.

According to an aspect of the present disclosure, a semiconductor integrated circuit device includes: at least two I/O cell rows each including a plurality of I/O cells arranged in a first direction; a plurality of external connection pads; and a common power supply interconnect that connects together a plurality of first I/O cells configured either as I/O cells for supplying a power supply potential or as I/O cells for supplying a ground potential. Each of the first I/O cells is included in a respective one of the at least two I/O cell rows. The first I/O cells connected together via the common power supply interconnect are arranged so as to overlap with each other in the first direction. The common power supply interconnect extends in a second direction perpendicular to the first direction, and is connected to a first pad which is one of in the plurality of external connection pads and is located closest to the common power supply interconnect in the first direction among the plurality of external connection pads.

The semiconductor integrated circuit device according to this aspect includes at least two I/O cell rows, and a common power supply interconnect connects together a plurality of first I/O cells for supplying a power supply potential or a ground potential that are each included in a respective one of the I/O cell rows. The first I/O cells connected together via the common power supply interconnect are arranged so as to overlap with each other in the first direction. The common power supply interconnect extends in a second direction perpendicular to the first direction, and is connected to a first pad which is located closest to the common power supply interconnect in the first direction. This configuration enables each of the at least two I/O cell rows to be supplied with power from another one of the cell rows and to utilize the ESD protection function of another cell row. Thus, this configuration may enhance the power supply ability and the ESD protection capability without increasing the number of the I/O cells in each of the I/O cell rows. Further, this configuration may reduce an increase in interconnect resource required for the common power supply interconnect and keep an interconnect resistance value of the common power supply interconnect low.

According to another aspect of the present disclosure, a semiconductor integrated circuit device includes: first and second I/O cell rows each including a plurality of I/O cell arranged in a first direction; and an internal logic circuit arranged between the first and second I/O cell rows. In the semiconductor integrated circuit device, the first I/O cell row is arranged inwardly from the internal logic circuit, and the second I/O cell row is arranged outwardly from the internal logic circuit. The I/O cells in the first and second I/O cell rows each include a high power supply voltage region and a low power supply voltage region separated from each other in a second direction perpendicular to the first direction. The I/O cells in the first and second I/O cell rows are arranged such that each low power supply voltage region is located closer to the internal logic circuit. The first I/O cell row includes at least one first I/O cell which is configured as an I/O cell for inputting and outputting a signal and which has a signal terminal in the low power supply voltage region of the first I/O cell. The signal terminal of the first I/O cell is connected to the internal logic circuit via a signal interconnect.

According to this aspect, an internal logic circuit is arranged between the first and second I/O cell rows. The first I/O cell row is arranged inwardly from the internal logic circuit whereas the second I/O cell row is arranged outwardly from the internal logic circuit. The I/O cells in the first and second I/O cell rows are each divided into a high power supply voltage region and a low supply voltage region in a second direction that is perpendicular to the first direction, and are arranged such that each low power supply voltage region is located closer to the internal logic circuit. This configuration allows a reduction in the length of the signal interconnect that connects the internal logic circuit to the first I/O cell row located inwardly from the logic circuit in the semiconductor integrated circuit device. As a result, signals may be transmitted faster, and power consumption may be reduced.

The semiconductor integrated circuit device according to the present closure may ensure sufficient power supply ability and ESD protection capability for I/O cell rows, without increasing the area of the semiconductor integrated circuit.

DETAILED DESCRIPTION

Embodiments of the present disclosure will be described below with reference to the drawings.

First Embodiment

Figure 1:
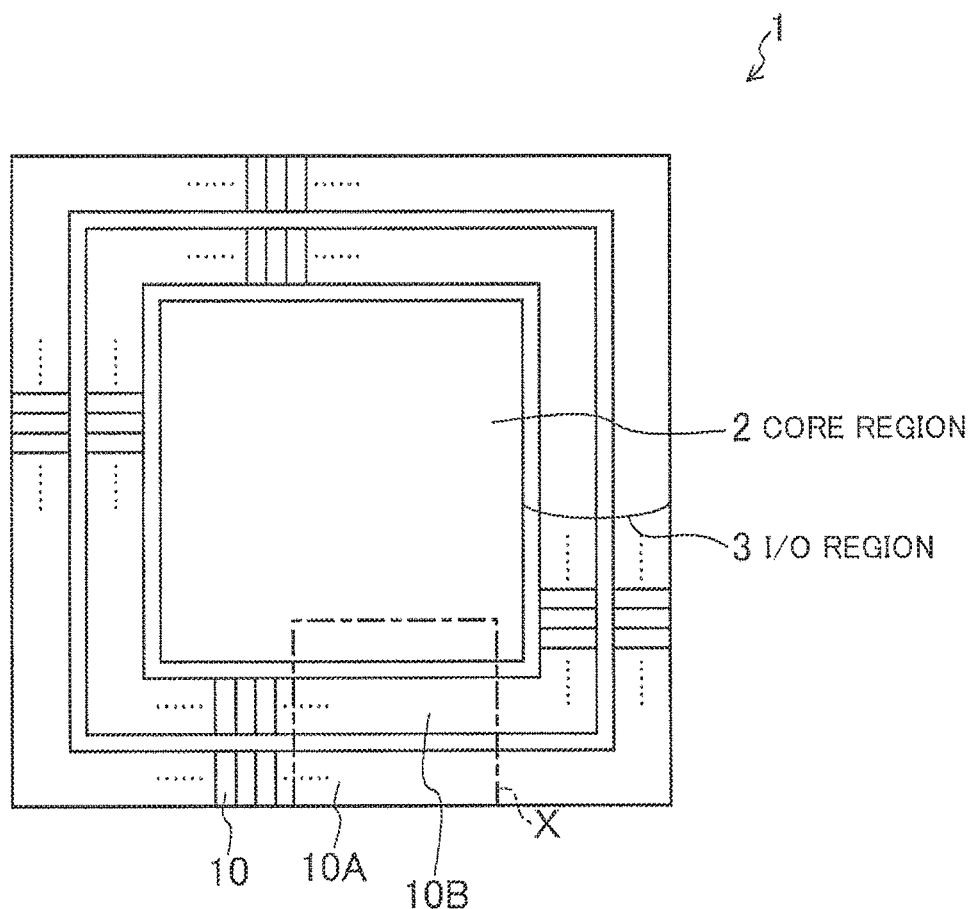
FIG. 1 is a plan view schematically illustrating an entire configuration for a semiconductor integrated circuit device according to an embodiment.

FIG. 1 is a plan view schematically illustrating an entire configuration for a semiconductor integrated circuit device according to an embodiment. The semiconductor integrated circuit device 1 illustrated in FIG. 1 includes a core region 2 in which an internal core circuit is provided, and an I/O region 3 which surrounds the core region 2 and in which an interface circuit (i.e., an I/O circuit) is provided. In the I/O region 3, two I/O cell rows 10A and 10B having a ring or frame shape extends along the periphery of the semiconductor integrated circuit device 1. Although not illustrated in detail in FIG. 1, a plurality of I/O cells 10 that form an interface circuit are arranged in each of the I/O cell rows 10A and 10B. Further, the semiconductor integrated circuit device 1 includes a plurality of external connection pads (not shown in FIG. 1) arranged therein.

Figure 2:
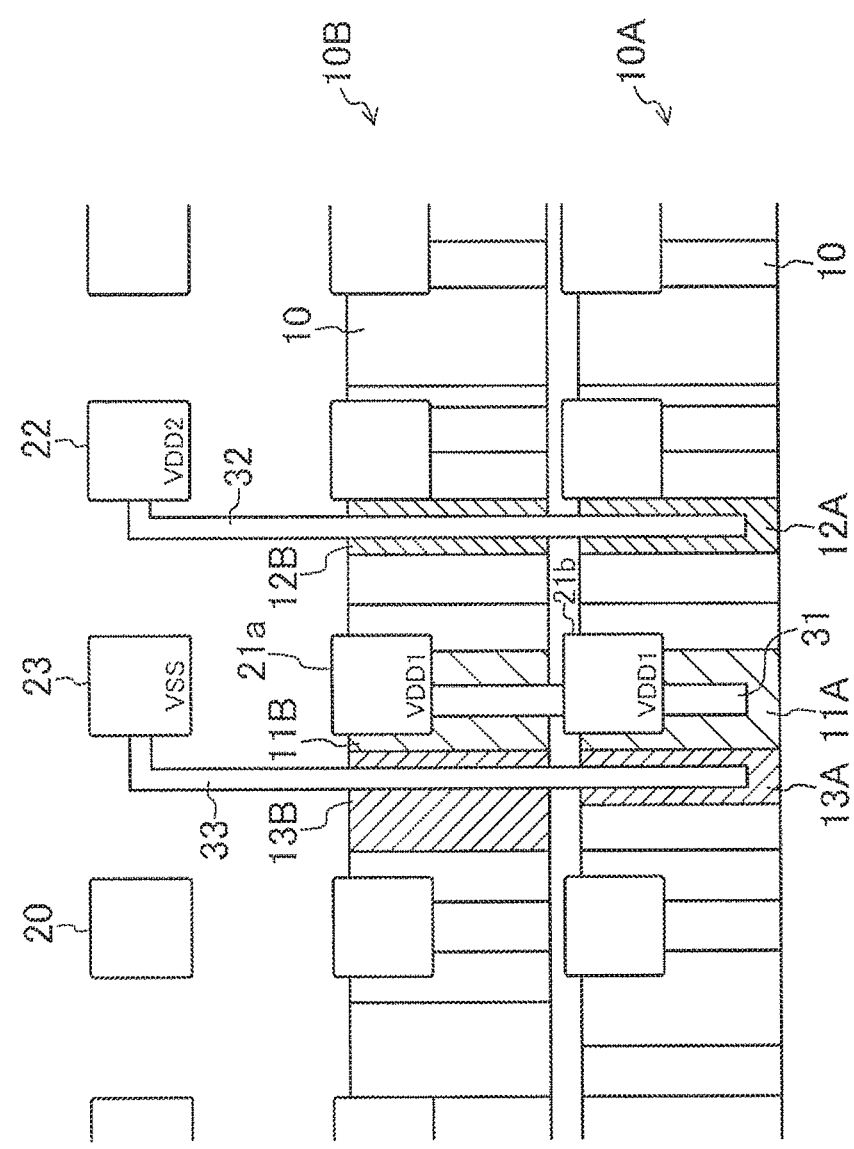
FIG. 2 illustrates an exemplary configuration for an I/O region of a semiconductor integrated circuit device according to a first embodiment.

FIG. 2 illustrates an exemplary configuration for the I/O region 3 of the semiconductor integrated circuit device 1 according to this embodiment, and corresponds to an enlarged view of the portion X in FIG. 1. Note that FIG. 2 does not show an internal configuration for each I/O cell, signal interconnects, or other elements. In FIG. 2, the two I/O cell rows 10A and 10B each include a plurality of I/O cells 10 arranged in a horizontal direction corresponding to a first direction in FIG. 2 (i.e., a direction defined along one external side of semiconductor integrated circuit device 1). A plurality of external connection pads 20 are arranged in a layer overlying the I/O cell rows 10A and 10B. Note that the semiconductor integrated circuit device according to this embodiment is supplied with two different power supply potentials, and the external connection pads 20 include pads 21a and 21b through which a first power supply potential (VDD1) is supplied, a pad 22 through which a second power supply potential (VDD2) is supplied, and a pad 23 through which a ground potential (VSS) is supplied. For example, the VDD1 is set to be 3.3 V, and the VDD2 is set to be 1.8 V. The external connection pads 20 are connected to a device outside the semiconductor integrated circuit device 1.

The I/O cell row 10A includes an I/O cell 11A for supplying VDD1, an I/O cell 12A for supplying VDD2, and an I/O cell 13A for supplying VSS. Likewise, the I/O cell row 10B includes an I/O cell 11B for supplying VDD1, an I/O cell 12B for supplying VDD2, and an I/O cell 13B for supplying VSS. These I/O cells 11A, 11B, 12A, 12B, 13A, and 13B for supplying a power supply potential supply or a ground potential each include an ESD protection circuit comprised of MOS transistors or diodes, for example. The other I/O cells 10 are provided mainly for inputting and outputting signals.

The I/O cells 11A and 11B for supplying VDD1 (which are both marked with the same type of hatching in FIG. 2) have the same dimension and are arranged at the same position in the horizontal direction in the figure. That is, the I/O cells 11A and 11B occupy the same range in the horizontal direction in the figure. Likewise, the I/O cells 12A and 12B for supplying VDD2 (which are both marked with the same type of hatching in FIG. 2) have the same dimension and are arranged at the same position in the horizontal direction in the figure. That is, the I/O cells 12A and 12B occupy the same range in the horizontal direction in the figure. The I/O cells 13A and 13B for supplying VSS (which are both marked with the same type of hatching in FIG. 2) have different dimensions but are arranged so as to overlap with each other in the horizontal direction in the figure.

The configuration illustrated in FIG. 2 further includes a common power supply interconnect 31 connecting together the I/O cells 11A and 11B for supplying VDD1 and functioning as first I/O cells, a common power supply interconnect 32 connecting together the I/O cells 12A and 12B for supplying VDD2 and functioning as first I/O cells, and a common power supply interconnect 33 connecting together the I/O cells 13A and 13B for supplying VSS and functioning as first I/O cells. Each of the common power supply interconnects 31, 32, and 33 extends in the vertical direction in the figure, which corresponds to a second direction perpendicular to the first direction. The common power supply interconnect 31 is connected not only to the pads 21a and 21b through which VDD1 is supplied, but also to the I/O cells 11A and 11B via interconnects or vias (not shown), for example. The pads 21a and 21b functioning as first pads are located closest to the common power supply interconnect 31 in the horizontal direction in the figure among the external connection pads 20. In FIG. 2, the common power supply interconnect 31 overlaps with the pads 21a and 21b in a plan view. The common power supply interconnect 32 is connected not only to the pad 22 through which VDD2 is supplied, but also to the I/O cells 12A and 12B via interconnects or vias (not shown), for example. The pad 22 is located closest to the common power supply interconnect 32 in the horizontal direction in the figure among the external connection pads 20. The common power supply interconnect 33 is connected not only to the pad 23 through which VSS is supplied, but also to the I/O cells 13A and 13B via interconnects or vias (not shown), for example. The pad 23 is located closest to the common power supply interconnect 33 in the horizontal direction in the figure among the external connection pads 20. In FIG. 2, the external connection pads 20 and the common power supply interconnects 31, 32, and 33 form a single interconnect layer. However, these pads and interconnects may form two or more different interconnect layers. In the latter case, the external connection pads 20 are connected to the respective common power supply interconnects 31, 32, and 33 via interconnects or vias, for example.

In the configuration illustrated in FIG. 2, in the two I/O cell rows 10A and 10B, the I/O cells 11A and 11B for supplying VDD1 are connected together via the common power supply interconnect 31, the I/O cells 12A and 12B for supplying VDD2 are connected together via the common power supply interconnect 32, and the I/O cells 13A and 13B for supplying VSS are connected together via the common power supply interconnect 33. This configuration enables each of the I/O cell rows 10A and 10B to be supplied with power by the other row and to utilize the ESD protection function of the other row. Thus, this configuration may enhance the power supply ability and the ESD protection capability without having to increase the number of the I/O cells in any of the I/O cell rows 10A and 10B, and therefore, without having to increase the area of the semiconductor integrated circuit.

In addition, the I/O cells 11A and 11B for supplying VDD1 occupy the same range in the horizontal direction in the figure, and the I/O cells 12A and 12B for supplying VDD2 also occupy the same range in the horizontal direction in the figure. The I/O cells 13A and 13B for supplying VSS are arranged so as to overlap with each other in the horizontal direction in the figure. This arrangement of the I/O cells enables the common power supply interconnects 31, 32, and 33 to be implemented as interconnects extending in the vertical direction in the figure. Further, the common power supply interconnects 31, 32, and 33 are connected respectively to the pads 21a, 21b, 22, and 23 that are located closest to them 31, 32, and 33 in the horizontal direction in the figure. This configuration may reduce an increase in interconnect resource required for the common power supply interconnects and keep an interconnect resistance value of the common power supply interconnects low. Note that the I/O cells connected together do not have to be aligned with each other across the horizontal direction in the figure to achieve these advantages. The advantages may also be achieved by arranging the I/O cells connected together so as to overlap with each other in the horizontal direction in the figure.

Moreover, the two I/O cells 12A and 12B for supplying VDD2 are connected to the single pad 22, and the two I/O cells 13A and 13B for supplying VSS are connected to the single pad 23, resulting in a reduction in the number of the pads for power supply. Alternatively, connection to two or more pads is also be adoptable, just like the I/O cells 11A and 11B for supplying VDD1 that are connected to the multiple pads 21a and 21b. Increasing the number of the connected pads may reduce inductance and impedance in a package. Note that the advantage of reduction in the number of the pads may be achieved if the number of the pads connected to one common power supply interconnect is smaller than the number of the I/O cells connected together via the same common power supply interconnect.

Just like the common power supply interconnect 31 connecting together the I/O cells 11A and 11B for supplying VDD1 and overlapping with the pads 21a and 21b, each common power supply interconnect may overlap with the associated pad in a plan view. Such overlapping may further reduce an increase in the interconnect resource.

Furthermore, in the configuration illustrated in FIG. 2 where the semiconductor integrated circuit device supplied with the two different power supply potentials VDD1 and VDD2 and the ground potential VSS is exemplified, the configuration according to this embodiment is applied to each of VDD1, VDD2, and VSS. However, the present disclosure is not limited to this. For example, the configuration according to this embodiment may be applied only to the power supply potential VDD1. Alternatively, for a semiconductor integrated circuit device supplied with one power supply potential and one ground potential, the configuration according to this embodiment may be applied to either one or both of the power supply and ground potentials.

The configuration illustrated in FIG. 2 includes two I/O cell rows 10A and 10B. However, the present disclosure is not limited to this. The configuration according to this embodiment may also be applied to three or more I/O cell rows. Alternatively, for a semiconductor integrated circuit device including three or more I/O cell rows, the configuration according to this embodiment may be applied to at least two, not all, of the three or more I/O cell rows.

Further, the I/O cell rows 10A and 10B described above each have a ring or frame shape and extend along the periphery of the semiconductor integrated circuit device 1. However, the present disclosure is not limited to this. For example, the I/O cell rows 10A and 10B may extend along a portion of the periphery of the semiconductor integrated circuit device 1. Moreover, the configuration according to this embodiment does not have to be applied to the entire I/O cell rows 10A and 10B, but may suitably be applied to a portion of the I/O cell rows 10A and 10B.

Second Embodiment

Figure 3:
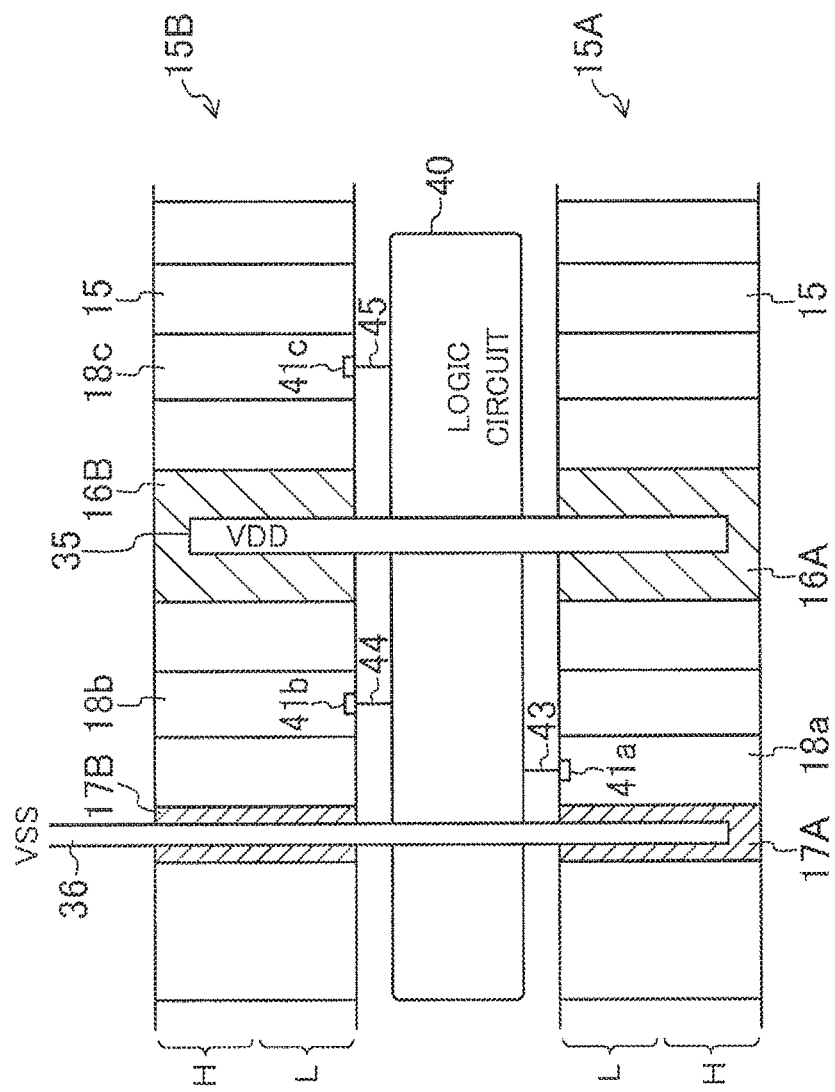
FIG. 3 illustrates an exemplary configuration for an I/O region of a semiconductor integrated circuit device according to a second embodiment.

FIG. 3 illustrates an exemplary configuration for an I/O region 3 of a semiconductor integrated circuit device according to a second embodiment, and corresponds to an enlarged view of the portion X in FIG. 1. Note that FIG. 3 does not show an internal configuration for each I/O cell, signal interconnects, or other elements which do not constitute points of this embodiment. The configuration illustrated in FIG. 3 includes two I/O cell rows 15A and 15B, instead of the two I/O cell rows of 10A and 10B illustrated in FIG. 1. The I/O cell rows 15A and 15B each include a plurality of I/O cells 15 arranged in a horizontal direction in the figure which corresponds to a first direction. An internal logic circuit 40 is arranged between the I/O cell rows 15A and 15B. This internal logic circuit 40 between the I/O cell rows 15A and 15B forms part of an internal logic circuit which would be provided entirely in a core region 2 according to the known art. In the semiconductor integrated circuit device illustrated in FIG. 3, the I/O cell row 15B functioning as a first I/O cell row is arranged inwardly from the internal logic circuit 40, and the I/O cell row 15A functioning as a second I/O cell row is arranged outwardly from the internal logic circuit 40. Although not illustrated in FIG. 3, the semiconductor integrated circuit device further includes external connection pads arranged therein.

The I/O cell row 15A includes an I/O cell 16A for supplying a power supply potential (VDD) and an I/O cell 17A for supplying a ground potential (VSS). The I/O cell row 15B includes an I/O cell 16B for supplying VDD and an I/O cell 17B for supplying VSS. These I/O cells 16A, 16B, 17A, and 17B for supplying a power supply potential or a ground potential each include an ESD protection circuit comprised of MOS transistors or diodes, for example. The other I/O cells 15 are provided mainly for inputting and outputting signals. For example, the I/O cell row 15A includes an I/O cell 18a for inputting and outputting signals and the I/O cell row 15B includes I/O cells 18b and 18c for inputting and outputting signals. The I/O cells 18a, 18b, and 18c for inputting and outputting signals include signal terminals 41a, 41b, and 41c, respectively. The signal terminals 41a, 41b, and 41c are connected to the internal logic circuit 40 via signal interconnects 43, 44, and 45, respectively.

The I/O cells 16A and 16B for supplying VDD (which are both marked with the same type of hatching in FIG. 3) have the same dimension and are arranged at the same position in the horizontal direction in the figure. That is, the I/O cells 16A and 16B occupy the same range in the horizontal direction in the figure. Likewise, the I/O cells 17A and 17B for supplying VSS (which are both marked with the same type of hatching in FIG. 3) have the same dimension and are arranged at the same position in the horizontal direction in the figure. That is, the I/O cells 17A and 17B occupy the same range in the horizontal direction in the figure. The configuration illustrated in FIG. 3 further includes a common power supply interconnect 35 connecting together the I/O cells 16A and 16B for supplying VDD, and a common power supply interconnect 36 connecting together the I/O cells 17A and 17B for supplying VSS. Each of the common power supply interconnects 35 and 36 extends in the vertical direction in the figure, which corresponds to a second direction perpendicular to the first direction. Further, the common power supply interconnects 35 and 36 are connected to the associated cells via interconnects or vias (not shown), for example.

The configuration illustrated in FIG. 3 further has the following features. A typical I/O cell has a high power supply voltage region including, for example, an ESD circuit and an output buffer for outputting a signal to a device outside the semiconductor integrated circuit device, and a low power supply voltage region including, for example, a circuit for inputting and outputting a signal to and from the semiconductor integrated circuit device. Each I/O cell illustrated in FIG. 3 is divided, in the vertical direction in the figure, into a high power supply voltage region (denoted by "H" in FIG. 3) and a low power supply voltage region (denoted by "L" in FIG. 3). The signal terminals 41a, 41b, and 41c are respectively provided in the low power supply voltage regions of the I/O cells 18a, 18b, and 18c for inputting and outputting signals to establish the connection to the internal logic circuit 40. In general, typical I/O cells are arranged such that their high power supply voltage regions, which are used mainly for inputting and outputting signals to and from an external device, are located outside in the semiconductor integrated circuit device, and their low power supply voltage regions, which are used mainly for inputting and outputting a signal to and from the internal core region, are located inside in the semiconductor integrated circuit device. By contrast, in the configuration illustrated in FIG. 3, the I/O cell row 15B is arranged such that its high power supply voltage region is located inside in the semiconductor integrated circuit device and its low power supply voltage region is located outside in the semiconductor integrated circuit device. In other words, the I/O cell rows 15A and 15B are both arranged such that their low power supply voltage regions are located closer to the internal logic circuit 40.

According to the configuration illustrated in FIG. 3, between the two I/O cell rows 15A and 15B, the I/O cells 16A and 16B for supplying VDD are connected together via, the common power supply interconnect 35, and the I/O cells 17A and 17B for supplying VSS are connected together via the common power supply interconnect 36. This configuration enables each of the I/O cell rows 15A and 15B to be supplied with power by the other row and to utilize the ESD protection function of the other row. Thus, this configuration may enhance the power supply ability and the ESD protection capability without having to increase the number of the I/O cells in each of the I/O cell rows 15A and 15B, and therefore, without having to increase the area of the semiconductor integrated circuit.

In addition, the I/O cells 16A and 16B for supplying VDD occupy the same range in the horizontal direction in the figure, and the I/O cells 17A and 17B for supplying VSS also occupy the same range in the horizontal direction in the figure. This arrangement of the I/O cells enables the common power supply interconnects 35 and 36 to be implemented as interconnects extending in the vertical direction in the figure. This configuration may reduce an increase in interconnect resource required for the common power supply interconnects and keep an interconnect resistance value of the common power supply interconnects low. Note that the I/O cells connected together do not have to be aligned with each other across the horizontal direction in the figure to achieve these advantages. The advantages may also be achieved by arranging the I/O cells connected together so as to overlap with each other in the horizontal direction in the figure.

Further, the I/O cell rows 15A and 15B are arranged such that the low power supply voltage region of each I/O cell 15 is located closer to the internal logic circuit 40. This arrangement allows a reduction in the length of the signal interconnects 44 and 45 connecting the internal logic circuit 40 to the I/O cell 18b and 18c for inputting and outputting signals, which function as the first I/O cells and are included in the I/O cell row 15B located inside in the semiconductor integrated circuit device. As a result, the signal may be transmitted faster, and power consumption may be reduced. The arrangement also achieves a reduction in the length of the signal interconnect 43 connecting the internal logic circuit 40 to the I/O cell 18a for inputting and outputting signals, which functions as the second I/O cell and is included in the I/O cell row 15A.

Note that the configuration according to this embodiment suitably includes at least one signal interconnect to connect the I/O cell row 15B to the internal logic circuit 40. Further, the signal interconnect connecting the I/O cell row 15A to the internal logic circuit 40 may be omitted from the configuration according to this embodiment.

The present disclosure may ensure, for an I/O cell row of a semiconductor integrated circuit device, sufficient power supply ability and ESD protection capability without increasing the area of the semiconductor integrated circuit. The present disclosure is thus useful for reducing the size of a very large-scale integrated circuit with a large number of signal input and output terminals, for example.

What is claimed is:

1. A semiconductor integrated circuit device comprising:
   at least two I/O cell rows each including a plurality of I/O cells arranged in a first direction;
   a plurality of external connection pads; and
   a common power supply interconnect that connects together a plurality of first I/O cells configured either as I/O cells for supplying a power supply potential or as I/O s for supplying a ground potential, the first I/O cells each included in a respective one of the at least two I/O cell rows, wherein
   the first I/O cells connected together via the common power supply interconnect are arranged so as to overlap with each other in the first direction, and
   the common power supply interconnect extends in a second direction perpendicular to the first direction, and is connected to a plurality of first pads which are included by the plurality of external connection pads and are located closest to the common power supply interconnect in the first direction among the plurality of external connection pads, and
   the plurality of first pads are arranged at a same position in the first direction.

2. The semiconductor integrated circuit device of claim 1, wherein the first I/O cells have a same dimension and are arranged at a same position in the first direction.

3. The semiconductor integrated circuit device of claim 1, wherein at least one of the at least two I/O cell rows extends in a ring or frame shape entirely along a periphery of the semiconductor integrated circuit device.

4. The semiconductor integrated circuit device of claim 1, wherein the common power supply interconnect overlaps with at least one of the plurality of first pads in a plan view.

5. The semiconductor integrated circuit device of claim 1, wherein at least one of the plurality of first pads overlaps with at least one of the plurality of first I/O cells.

6. A semiconductor integrated circuit device comprising:
at least two I/O cell rows each including a plurality of I/O cells arranged in a first direction;
a plurality of external connection pads;
a first common power supply interconnect that connects together a plurality of first I/O cells configured either as I/O cells for supplying a power supply potential or as I/O cells for supplying a ground potential, the first I/O cells each included in a respective one of the at least two I/O cell rows; and
a second common power supply interconnect that connects together a plurality of second I/O cells configured either as I/O cells for supplying a power supply potential or as I/O cells for supplying a ground potential, the second I/O cells each included in a respective one of the at least two I/O cell rows, wherein
the first I/O cells connected together via the first common power supply interconnect are arranged so as to overlap with each other in the first direction,
the second I/O cells connected together via the second common power supply interconnect are arranged so as to overlap with each other in the first direction,
the first common power supply interconnect extends in a second direction perpendicular to the first direction, and is connected to a first pad which is included by the plurality of external connection pads and is located closest to the first common power supply interconnect in the first direction among the plurality of external connection pads,
the second common power supply interconnect extends in the second direction and is connected to a second pad which is included by the plurality of external connection pads, and
the first pad and the second pad are arranged at a same position in the first direction.

7. The semiconductor integrated circuit device of claim 6, wherein the first I/O cells have a same dimension and are arranged at a same position in the first direction.

8. The semiconductor integrated circuit device of claim 6, wherein at least one of the at least two I/O cell rows extends in a ring or frame shape entirely along a periphery of the semiconductor integrated circuit device.

9. The semiconductor integrated circuit device of claim 6, wherein the first common power supply interconnect is connected to at least two of the plurality of external connection pads, where the at least two of the plurality of external connection pads include the first pad.

10. The semiconductor integrated circuit device of claim 6, wherein the first common power supply interconnect overlaps with the first pad in a plan view.

11. The semiconductor integrated circuit device of claim 6, wherein the first pad overlaps with at least one of the plurality of first I/O cells.

* * * * *